United States Patent [19]
Kikuchi et al.

[11] Patent Number: 5,894,037
[45] Date of Patent: Apr. 13, 1999

[54] SILICON SEMICONDUCTOR SUBSTRATE AND METHOD OF FABRICATING THE SAME

[75] Inventors: Hiroaki Kikuchi; Seiichi Shishiguchi, both of Tokyo, Japan

[73] Assignee: NEC Corporation, Tokyo, Japan

[21] Appl. No.: 08/749,649

[22] Filed: Nov. 15, 1996

[30] Foreign Application Priority Data

Nov. 22, 1995 [JP] Japan ................... 7-304790

[51] Int. Cl.$^6$ ...................... B05D 3/02
[52] U.S. Cl. ............ 427/372.2; 428/447; 438/455; 438/476; 148/33.3; 148/DIG. 1; 148/DIG. 60; 148/DIG. 147
[58] Field of Search .............. 428/447; 427/372.2; 438/455, 476; 148/33.3, DIG. 1, DIG. 60, DIG. 147

[56] References Cited

U.S. PATENT DOCUMENTS

| | | | |
|---|---|---|---|
| 4,645,546 | 2/1987 | Matsushita | 148/33 |
| 4,666,532 | 5/1987 | Korb et al. | 148/1.5 |
| 4,859,552 | 8/1989 | Yoshizawa et al. | 430/57 |
| 5,677,234 | 10/1997 | Koo et al. | 437/69 |

FOREIGN PATENT DOCUMENTS

| | | |
|---|---|---|
| 2-47836 | 2/1990 | Japan . |
| 3-238825 | 10/1991 | Japan . |

*Primary Examiner*—Randy Gulakowski
*Attorney, Agent, or Firm*—Young & Thompson

[57] ABSTRACT

A silicon semiconductor substrate including a silicon semiconductor layer at one of upper and lower surfaces thereof, the silicon semiconductor layer being composed of polysilicon or noncrystal silicon and containing oxygen in the range of 2 atomic % to 20 atomic % both inclusive, nitrogen in the range of 4 atomic % to 20 atomic % both inclusive, or both nitrogen at 2 atomic % or greater and oxygen at 1 atomic % or greater. The polysilicon or noncrystal silicon semiconductor layer acts as a core for extrinsic gettering. In the silicon semiconductor substrate, the gettering performance is not deteriorated, even if the silicon semiconductor substrate experiences thermal treatment. Thus, it is possible to get rid of contamination caused by heavy metals in the silicon semiconductor substrate.

5 Claims, 6 Drawing Sheets

SILICON SEMICONDUCTOR SUBSTRATE AND METHOD OF FABRICATING THE SAME

BACKGROUND OF THE INVENTION

1. Field of the Invention

The invention relates to a silicon semiconductor substrate and a method of fabricating the same, and more particularly to a silicon substrate including a defective layer to which gettering is carried out.

2. Description of the Related Art

As devices are formed on silicon substrate in smaller size and in higher integration, it becomes more important to prevent performance deterioration of devices caused by heavy metals intruding into a device during fabricating process, and fabrication yield deterioration. Thus, a technique for removing heavy metals out of a device formation region has been developed. Such a technique is called gettering technique. In general, gettering techniques can be grouped into intrinsic gettering and extrinsic gettering. In intrinsic gettering (IG), precipitation of oxygen contained in silicon and crystal defects caused by such precipitation act as a capturer of heavy metals. Extrinsic gettering is further grouped into BD, PDG and PG. In a so-called BD technique, crystal defects caused by artificially given mechanical damages act as a capturer of heavy metals. In phosphorus gettering (PDG), heavily phosphorus-doped diffusion layer acts as a capturer of heavy metals. In polysilicon gettering (PG) technique, a polysilicon layer formed on a bottom surface of a silicon substrate acts as a capturer of heavy metals.

For instance, Japanese Unexamined Patent Publication No. 3-238825 has suggested extrinsic gettering in which a carbon-doped polysilicon layer formed on a bottom surface of a semiconductor substrate is used to capture heavy metals. For another instance, Japanese Unexamined Patent Publication No. 2-47836 has suggested another extrinsic gettering in which a supersaturated oxygen-doped polysilicon layer is formed at a bottom surface of a semiconductor substrate for capturing heavy metals. In these extrinsic gettering techniques, carbon and oxygen contained in each of the polysilicon layers are diffused in a silicon semiconductor substrate. The thus diffused oxygen and carbon facilitate precipitation of oxygen contained in a substrate to thereby carry out gettering for capturing heavy metals.

Conventional intrinsic gettering has problems in that mechanisms for precipitating oxygen include extremely various and complicated factors, and it is quite difficult to completely control oxygen precipitation with the result of insufficient formation of a defective layer, and that there occurs defectiveness in a device formation region which should not have any defectiveness, thereby a production yield of a semiconductor device being reduced. Other problem is that mechanical strength of a silicon semiconductor substrate is remarkably reduced by reduction in interstitial oxygen concentration and occurrence of dislocation accompanied with oxygen precipitation, when oxygen is much precipitated, thereby there occurring a slip in a silicon semiconductor substrate during semiconductor device fabrication process, resulting in reduction in production yield of a semiconductor device.

Extrinsic gettering has a problem that crystal defects and crystal grains of polysilicon both acting as a core for gettering are eliminated in thermal treatment carried out during semiconductor device fabrication process, or crystal grains of polysilicon are grown up, and hence the gettering effects cannot last until the semiconductor device fabrication process is completed.

In the method of facilitating precipitation of oxygen contained in a substrate by means of supersaturated oxygen-doped polysilicon layer as suggested in the above mentioned Publication No. 2-47836, there can be obtained only small gettering effects against heavy metals when the oxygen concentration is low. In the method of facilitating precipitation of oxygen contained in a substrate by means of heavily oxygen- or carbon-doped polysilicon film as suggested in the above mentioned Publication No. 3-238825, similarly to the above mentioned intrinsic gettering, mechanical strength of a silicon semiconductor substrate is remarkable reduced by occurrence of dislocation accompanied with oxygen precipitation out of a silicon semiconductor substrate, thereby slip occurring in a silicon semiconductor substrate during semiconductor device fabrication process, resulting in reduction in production yield of a semiconductor device.

SUMMARY OF THE INVENTION

It is an object of the present invention to provide a silicon semiconductor substrate having high gettering performance which would not be deteriorated even if the silicon semiconductor substrate experienced a thermal treatment.

In one aspect, there is provided a silicon semiconductor substrate including a silicon semiconductor layer at an upper or lower surface thereof, the silicon semiconductor layer being composed of polysilicon or noncrystal silicon and containing oxygen in the range of 2 atomic % to 20 atomic %, $1 \times 10^{21}$–$1 \times 10^{22}$ atoms/cc, both inclusive.

There is further provided a silicon semiconductor substrate including a silicon semiconductor layer at an upper or lower surface thereof, the silicon semiconductor layer being composed of polysilicon or noncrystal silicon and containing nitrogen in the range of 4 atomic % to 20 atomic %, $2 \times 10^{21}$–$1 \times 10^{22}$ atoms/cc, both inclusive.

There is still further provided a silicon semiconductor substrate including a silicon semiconductor layer at an upper or lower surface thereof, the silicon semiconductor layer being composed of polysilicon or noncrystal silicon and containing nitrogen at 2 atomic %, $1 \times 10^{21}$ atoms/cc, or greater and oxygen at 1 atomic %, $5 \times 10^{20}$ atomic/cc, or greater.

In another aspect, there is provided a method of fabricating a silicon semiconductor substrate, including the step of: (a) forming a silicon semiconductor layer at one of upper and lower surfaces of the substrate, the silicon semiconductor layer being composed of polysilicon and containing oxygen in the range of 2 atomic % to 20 atomic % both inclusive; (b) forming a silicon semiconductor layer at one of upper and lower surfaces of the substrate, the silicon semiconductor layer being composed of polysilicon and containing nitrogen in the range of 4 atomic % to 20 atomic % both inclusive; or (c) forming a silicon semiconductor layer at one of upper and lower surfaces of the substrate, the silicon semiconductor layer being composed of polysilicon and containing nitrogen at 2 atomic % or greater and oxygen at 1 atomic % or greater.

There is further provided a method of fabricating a silicon semiconductor substrate, including the step of: (a) forming a silicon semiconductor layer at one of upper and lower surfaces of the substrate, the silicon semiconductor layer being composed of noncrystal silicon and containing oxygen in the range of 2 atomic % to 20 atomic % both inclusive, (b) forming a silicon semiconductor layer at one of upper and lower surfaces of the substrate, the silicon semiconductor layer being composed of noncrystal silicon and containing nitrogen in the range of 4 atomic % to 20 atomic % both inclusive; or (c) forming a silicon semiconductor layer at one of upper and lower surfaces of the substrate, the silicon semiconductor layer being composed of noncrystal silicon and containing nitrogen at 2 atomic % or greater and oxygen at 1 atomic % or greater, the method further including the step of (d) heating the silicon semiconductor substrate to transform the noncrystal silicon into polysilicon.

The silicon semiconductor substrate is preferably heated at a temperature in the range of 800° C. to 1100° C. both inclusive for an hour or longer.

The polysilicon semiconductor layer containing oxygen and/or nitrogen makes it possible to enhance gettering performance, which would not be deteriorated even if a silicon semiconductor substrate is thermally treated.

BRIEF DESCRIPTION OF THE DRAWINGS

The above and other objects and advantageous features of the present invention will be made apparent from the following description made with reference to the accompanying drawings, in which like reference characters designate the same or similar parts throughout the drawings, in which.

DESCRIPTION OF THE PREFERRED EMBODIMENTS

Figure 1:
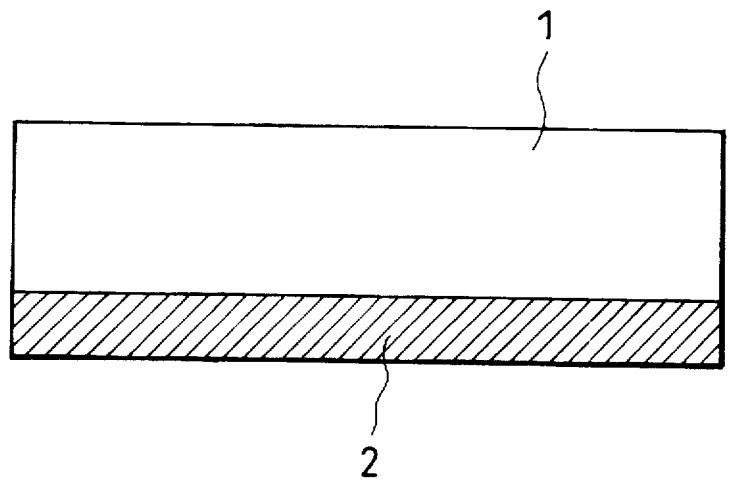
FIG. 1 is a cross-sectional view of a silicon semiconductor substrate made in accordance with the first embodiment of the present invention.

With reference to FIG. 1, there was prepared a silicon semiconductor substrate 1 having a diameter of 150 mm, a thickness of 675 μm, interstitial oxygen concentration of $1.4 \times 10^{18}$ cm$^{-3}$, and resistivity of about 10 Ω·cm. In one of principal planes, that is, in a bottom surface at which a device is not to be fabricated, there was formed a polysilicon semiconductor layer 2 having a thickness of 1 μm by means of low pressure chemical vapor deposition (LPCVD) at 650° C. using silane (SiH$_4$) at 1000 sccm and nitrous oxide (N$_2$O) at 0–50 sccm as process gases. The thus fabricated silicon semiconductor substrate was used as a sample hereinbelow.

Figure 2:
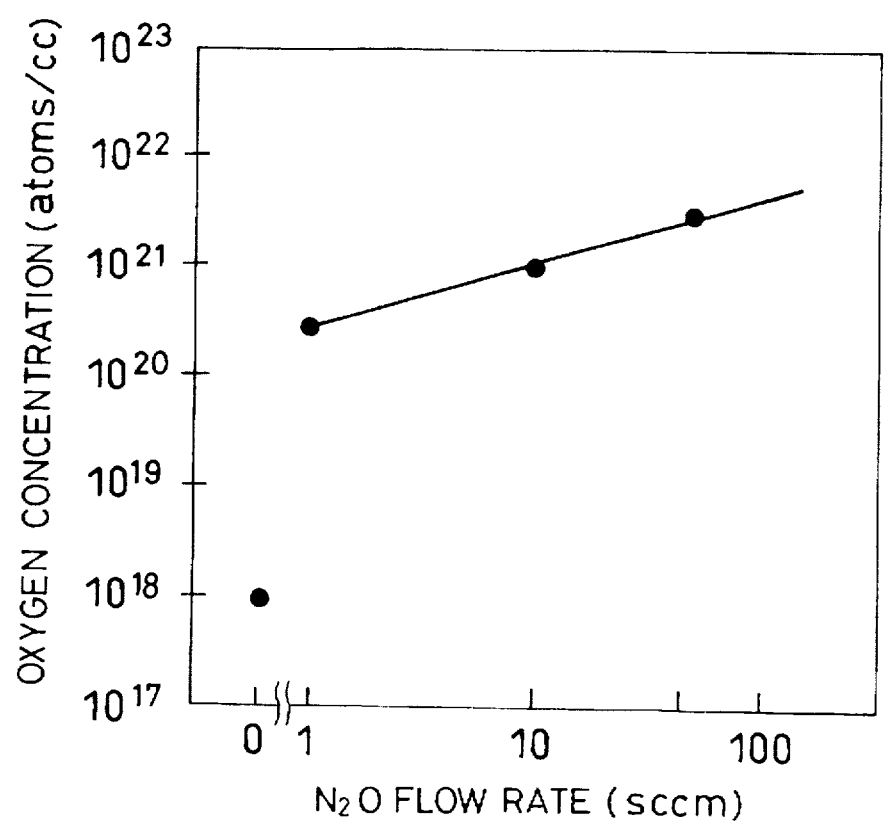
FIG. 2 is a graph showing the dependency of oxygen concentration on a flow rate of nitrous oxide with respect to a polysilicon semiconductor layer formed in the silicon semiconductor substrate illustrated in FIG. 1.
Figure 3:
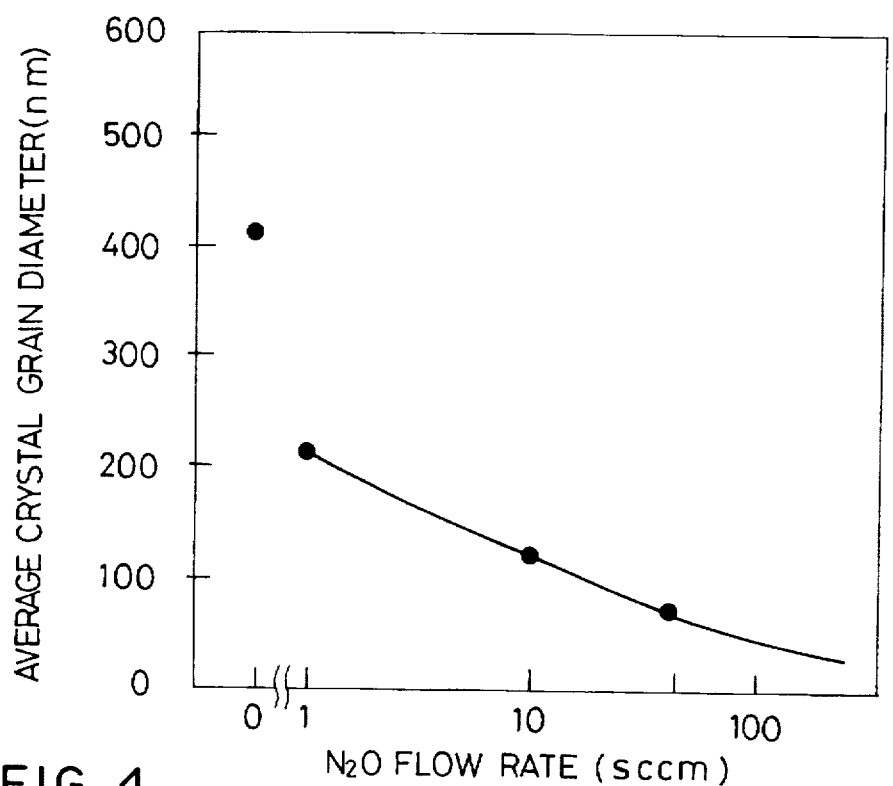
FIG. 3 is a graph showing the dependency of an average diameter of crystal grains on a flow rate of nitrous oxide with respect to a polysilicon semiconductor layer formed in the silicon semiconductor substrate illustrated in FIG. 1.

There were fabricated a plurality of silicon semiconductor substrates having dimensions as mentioned above with a flow rate of nitrous oxide being varied in the range of 0 to 50 sccm. Then, the dependency was measured of oxygen concentration in the polysilicon semiconductor layer 2 on a flow rate of nitrous oxide. FIG. 2 shows the results. As is clear in FIG. 2, the oxygen concentration in the polysilicon semiconductor layer 2 is increased as a nitrous oxide flow rate is increased. FIG. 3 shows the dependency of an average diameter of crystal grains on oxygen concentration in the polysilicon semiconductor layer 2. As is seen in FIG. 3, the average diameter is decreased, as the nitrous oxide flow rate is increased.

Figure 4:
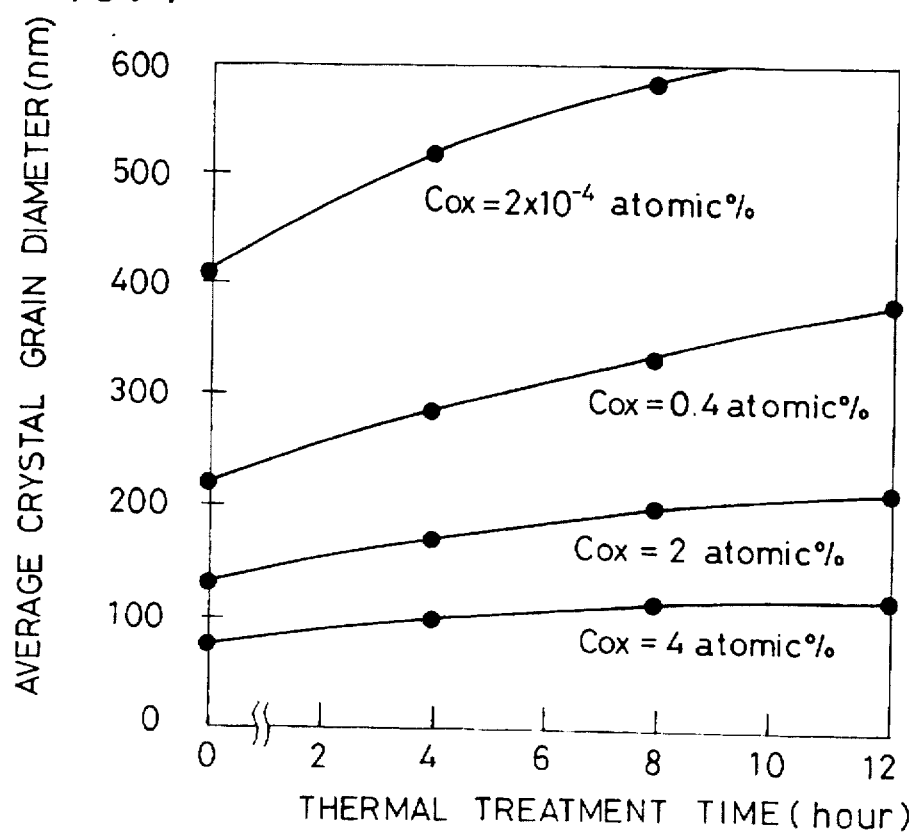
FIG. 4 is a graph showing the dependency of an average diameter of crystal grains on thermal annealing time with respect to a polysilicon semiconductor layer formed in the silicon semiconductor substrate illustrated in FIG. 1.

The silicon semiconductor substrates 1 having the polysilicon semiconductor layer 2 were thermally treated at 1100° C. in nitrogen atmosphere. The dependency of an average diameter of crystal grains in the polysilicon semiconductor layer 2 on thermal treatment time was evaluated. FIG. 4 shows the results. As is seen in FIG. 4, as the oxygen concentration in the polysilicon semiconductor layer 2 is increased, a diameter of crystal grains having experienced thermal treatment is saturated at smaller value. Thus, a diameter of crystal grains in the polysilicon semiconductor layer 2 containing oxygen therein is not so increased, even if the polysilicon semiconductor layer 2 is thermally treated, which means that the gettering performance of the layer 2 against heavy metals is not deteriorated.

Figure 5:
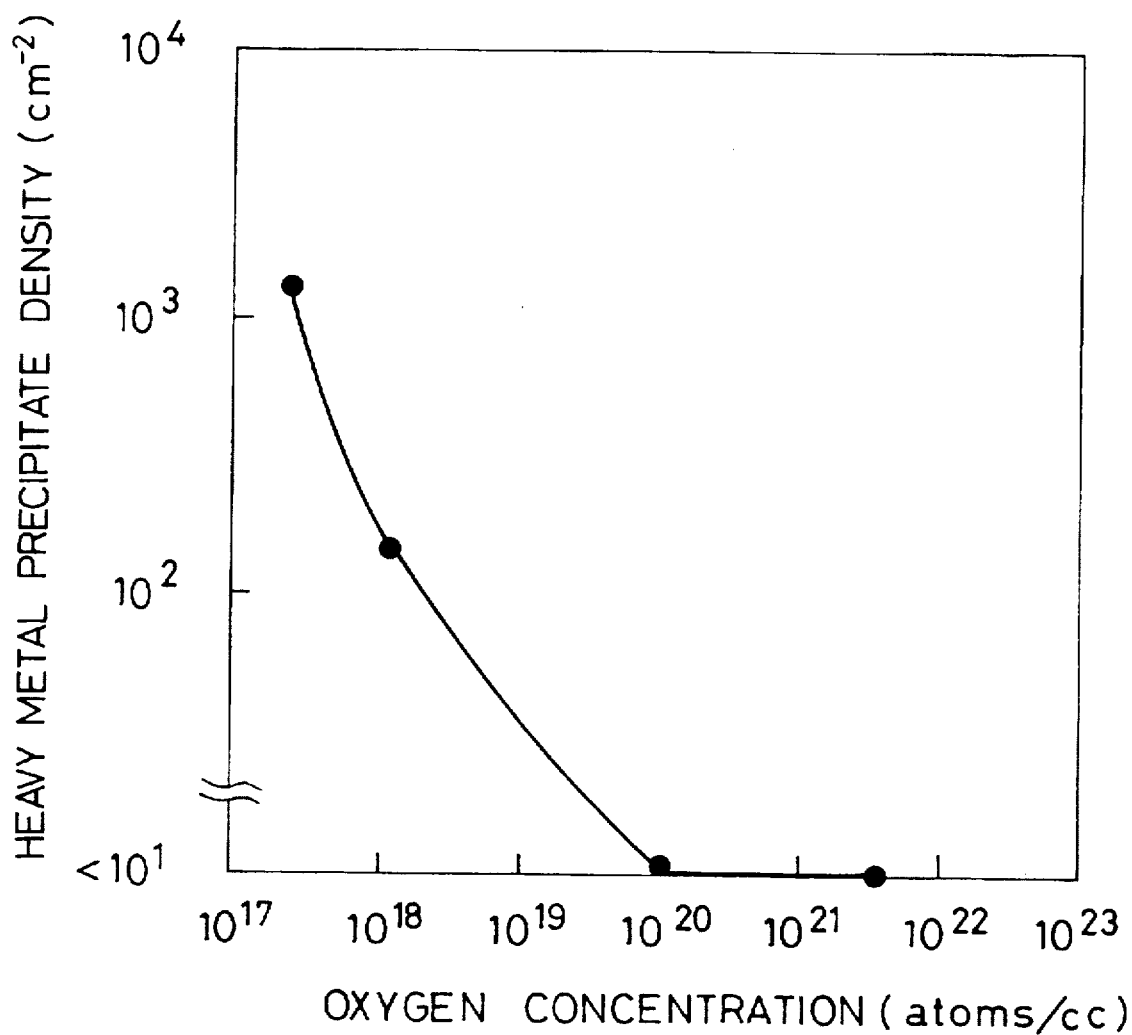
FIG. 5 is a graph showing the dependency of a density of heavy metal precipitate on oxygen concentration in a polysilicon semiconductor layer with respect to the silicon semiconductor substrate illustrated in FIG. 1.

There were prepared a plurality of silicon semiconductor substrates 1 formed with the polysilicon semiconductor substrate 2 having different oxygen concentrations, and copper (Cu) was diffused in the silicon semiconductor substrates 1. Then, a density of heavy metal precipitate was measured at a principal plane of the substrates 1 at which the polysilicon semiconductor layer 2 was not formed. The gettering performance against heavy metals was evaluated based on the thus measured heavy metal precipitate density. FIG. 5 shows the results of evaluation. As is seen in FIG. 5, as the oxygen concentration in the polysilicon semiconductor layer 2 is increased, the heavy metal precipitate density is decreased. In particular, when the polysilicon semiconductor layer 2 has the oxygen concentration of 2 atomic % or greater, there can be obtained higher gettering performance.

Figure 6A:
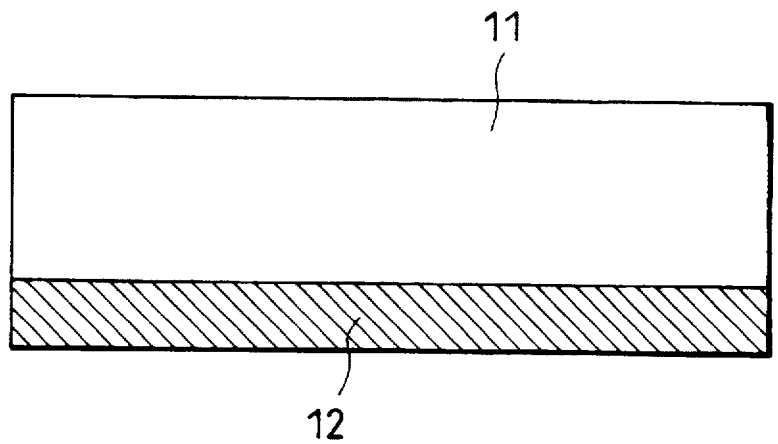
FIGS. 6A and 6B are cross-sectional views showing respective step of a method of fabricating a noncrystal silicon semiconductor layer from a polysilicon semiconductor layer.
Figure 6B:
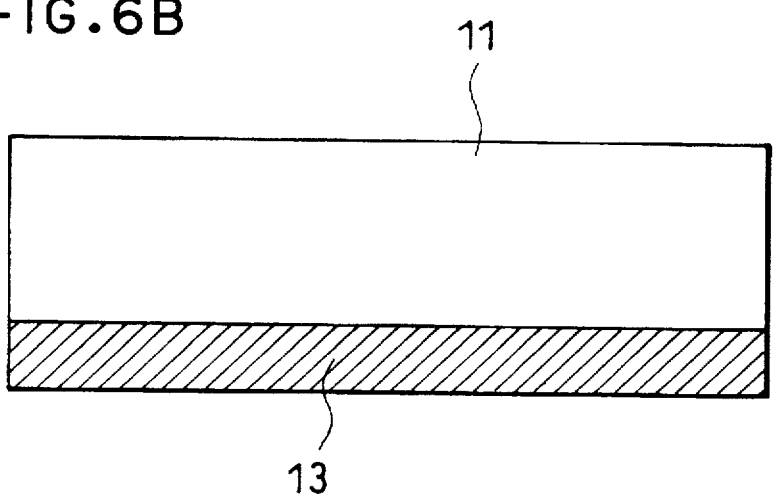

Turning to FIGS. 6A and 6B, hereinbelow is explained the second embodiment in accordance with the present invention. The polysilicon semiconductor layer containing oxygen therein can be formed by thermally annealing a noncrystal silicon semiconductor film. First, as illustrated in FIG. 6A, there is formed a noncrystal silicon semiconductor layer 12 over one of principal planes of a silicon semiconductor substrate 11 by means of low pressure chemical vapor deposition (LPCVD) at 580° C. using silane ($SiH_4$) at 1000 sccm and nitrous oxide ($N_2O$) at 1 sccm or greater. The noncrystal silicon semiconductor layer 12 has a thickness of 1 μm. Then, as illustrated in FIG. 6B, the silicon semiconductor substrate 1 is heated at temperature in the range of 800° C. to 1100° C. for an hour or longer to thereby transform the noncrystal silicon semiconductor layer 12 to a polysilicon semiconductor layer 13.

Thermal treatment to be carried out at initial stage during a device fabrication process at the same temperature and for the same time as the above mentioned may be substituted for thermal treatment for transforming the noncrystal silicon semiconductor layer 12 to the polysilicon semiconductor layer 13. Thus, by forming the noncrystal silicon semiconductor layer 12 over a surface of the silicon semiconductor substrate 11 in place of the earlier mentioned polysilicon semiconductor layer 13 prior to starting a semiconductor device fabrication process, the polysilicon semiconductor layer 13 is naturally formed during the process, in other words, the present invention is reduced into practice.

Figure 7:
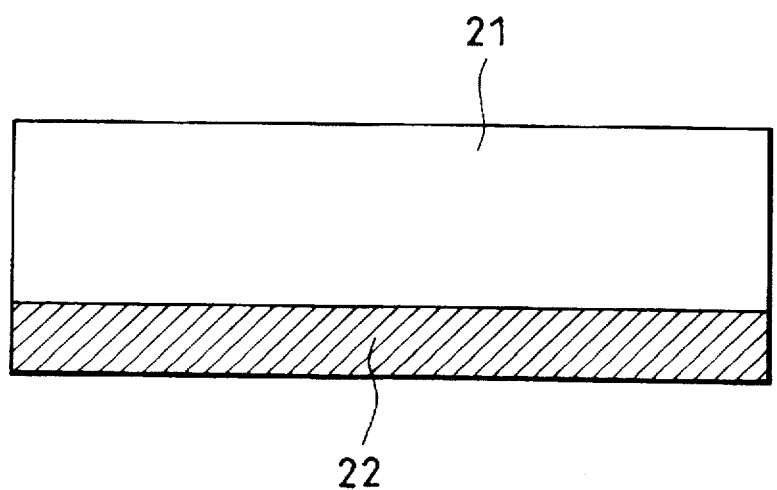
FIG. 7 is a cross-sectional view of a silicon semiconductor substrate made in accordance with the second embodiment of the present invention.

Turning to FIG. 7, hereinbelow is explained the third embodiment. There was prepared a silicon semiconductor substrate 21 having a diameter of 150 mm, a thickness of 675 μm, interstitial oxygen concentration of $1.4 \times 10^{18}$ $cm^{-3}$, and resistivity of about 10 Ω·cm. In one of principal planes, that is, in a bottom surface at which a device is not to be fabricated, there was formed a polysilicon semiconductor layer 22 having a thickness of 1 μm by means of LPCVD at 650° C. using silane ($SiH_4$) at 1000 sccm and ammonia ($NH_3$) at 0–5 sccm as process gases. The thus fabricated silicon semiconductor substrate was used as a sample hereinbelow in the third embodiment.

Figure 8:
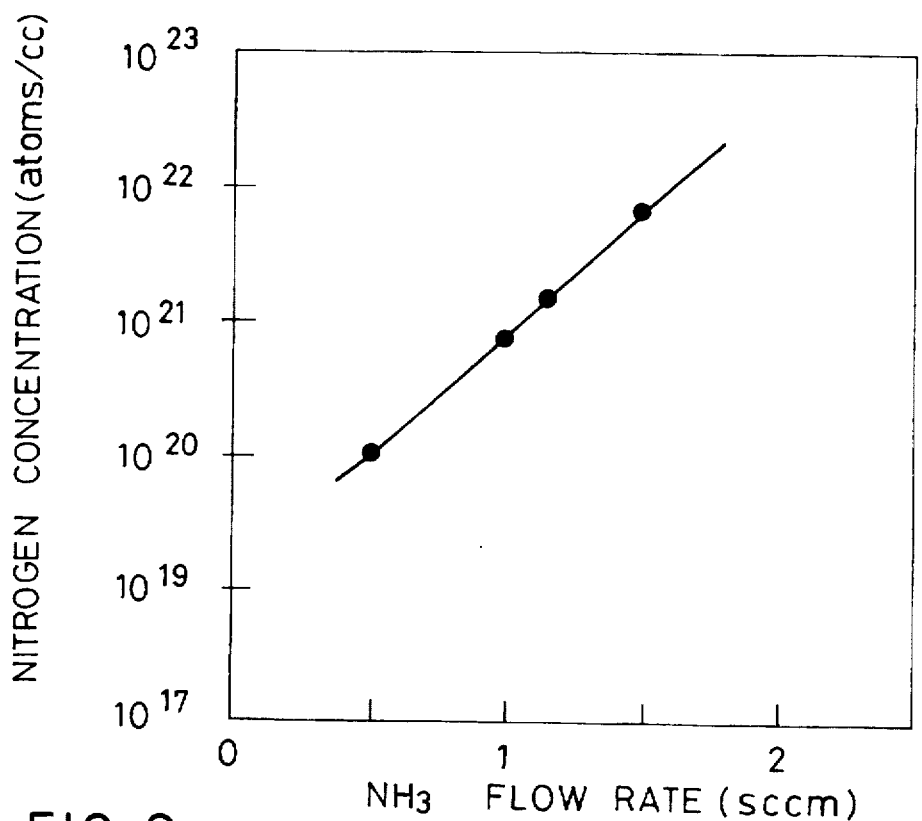
FIG. 8 is a graph showing the dependency of nitrogen concentration on a flow rate of ammonia with respect to a polysilicon semiconductor layer formed in the silicon semiconductor substrate illustrated in FIG. 7.
Figure 9:
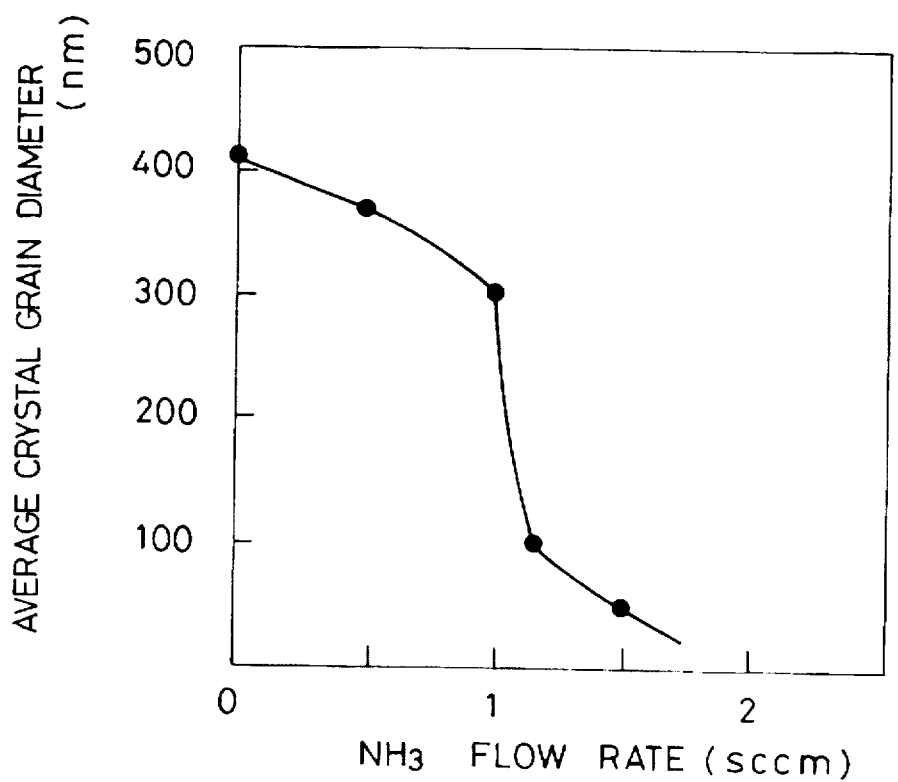
FIG. 9 is a graph showing the dependency of an average diameter of crystal grains on a flow rate of ammonia with respect to a polysilicon semiconductor layer formed in the silicon semiconductor substrate illustrated in FIG. 7.

There were fabricated a plurality of silicon semiconductor substrates 21 having dimensions as mentioned above with a flow rate of ammonia being varied in the range of 0 to 5 sccm. Then, the dependency was measured of nitrogen concentration in the polysilicon semiconductor layer 22 on a flow rate of ammonia. FIG. 8 shows the results. As is clear in FIG. 8, the nitrogen concentration in the polysilicon semiconductor layer 22 is increased as a ammonia flow rate is increased. FIG. 9 shows the dependency of an average diameter of crystal grains on nitrogen concentration in the polysilicon semiconductor layer 22. As is seen in FIG. 9, the average diameter is decreased, as the ammonia flow rate is increased.

Figure 10:
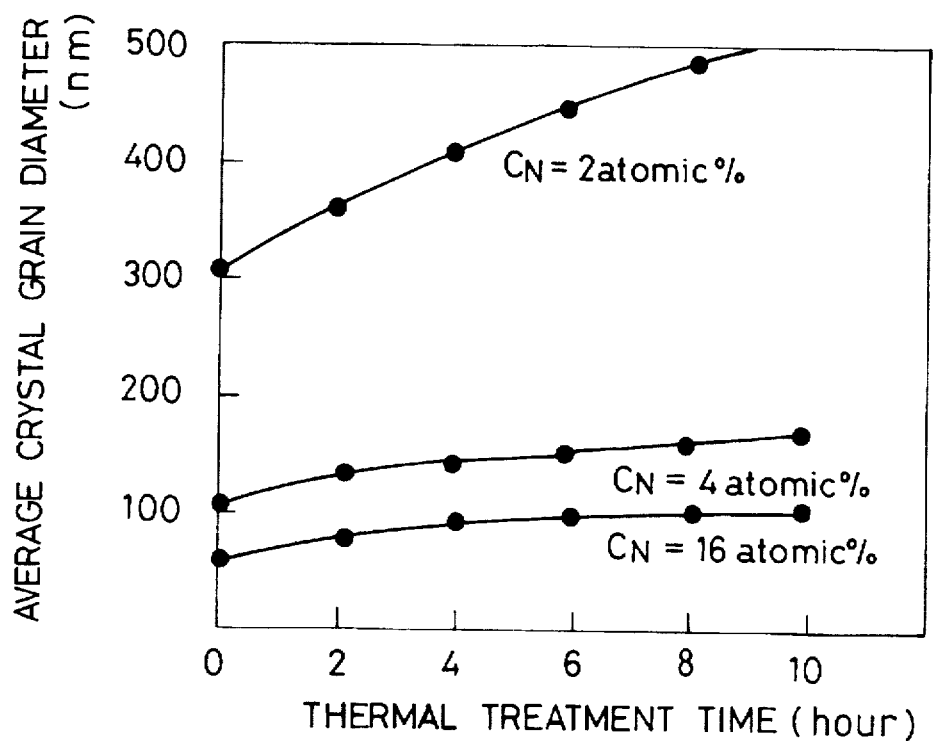
FIG. 10 is a graph showing the dependency of an average diameter of crystal grains on thermal annealing time with respect to a polysilicon semiconductor layer formed in the silicon semiconductor substrate illustrated in FIG. 7.

The silicon semiconductor substrates 21 having the polysilicon semiconductor layer 22 were thermally treated at 1100° C. in nitrogen atmosphere. The dependency of an average diameter of crystal grains in the polysilicon semiconductor layer 22 on thermal treatment time was evaluated. FIG. 10 shows the results. As is seen in FIG. 10, as the nitrogen concentration in the polysilicon semiconductor layer 22 is increased, a diameter of crystal grains having experienced thermal treatment is saturated at smaller value. Thus, a diameter of crystal grains in the polysilicon semiconductor layer 2 containing oxygen therein is not so increased, even if the polysilicon semiconductor layer 22 is thermally treated, which means that the gettering performance of the layer 22 against heavy metals is not deteriorated, similarly to the above mentioned first embodiment.

Figure 11:
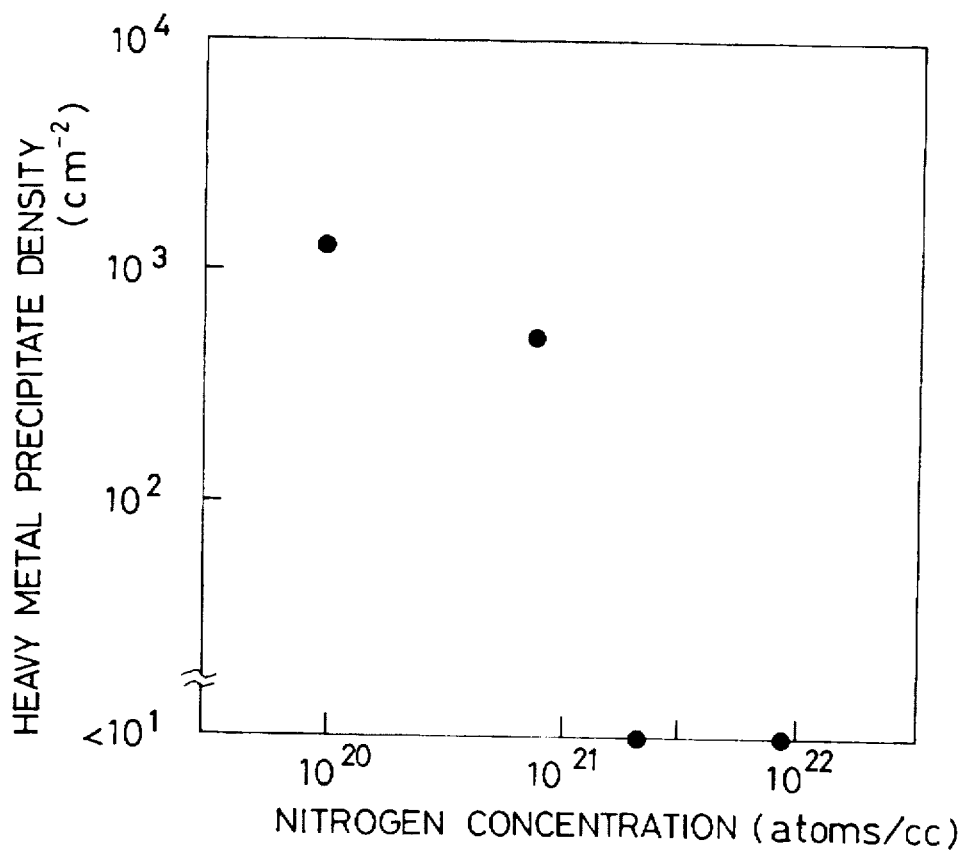
FIG. 11 is a graph showing the dependency of a density of heavy metal precipitate on nitrogen concentration in a polysilicon semiconductor layer with respect to the silicon semiconductor substrate illustrated in FIG. 7.

There were prepared a plurality of silicon semiconductor substrates 21 formed with the polysilicon semiconductor substrate 22 having different nitrogen concentrations, and copper (Cu) was diffused in the silicon semiconductor substrates 21. Then, a density of heavy metal precipitate was measured at a principal plane of the substrates 21 at which the polysilicon semiconductor layer 22 was not formed. The gettering performance against heavy metals was evaluated based on the thus measured heavy metal precipitate density. FIG. 11 shows the results of evaluation. As is seen in FIG. 11, as the nitrogen concentration in the polysilicon semiconductor layer 22 is increased, the heavy metal precipitate density is decreased. In particular, when the polysilicon semiconductor layer 22 has the nitrogen concentration of 4 atomic % or greater, there can be obtained higher gettering performance.

The above mentioned third embodiment provides higher resistance to both acid and high temperature thermal treatment to a silicon semiconductor substrate relative to the first embodiment.

The polysilicon semiconductor layer containing nitrogen therein can be formed by thermally annealing a noncrystal silicon semiconductor film, similarly to the second embodiment. First, there is formed a noncrystal silicon semiconductor layer over one of principal planes of a silicon semiconductor substrate by means of LPCVD at 580° C. using silane ($SiH_4$) at 1000 sccm and ammonia ($NH_3$) at 10 sccm or greater. The thus formed noncrystal silicon semiconductor layer has a thickness of 1 μm. Then, the silicon semiconductor substrate is heated at temperature in the range of 800° C. to 1100° C. for an hour or longer to thereby transform the noncrystal silicon semiconductor layer to a polysilicon semiconductor layer.

Similarly to the first embodiment, thermal treatment to be carried out at initial stage during a device fabrication process at the same temperature and for the same time as the above mentioned may be substituted for thermal treatment for transforming a noncrystal silicon semiconductor layer to a polysilicon semiconductor layer. Thus, by forming the noncrystal silicon semiconductor layer over a surface of the silicon semiconductor substrate in place of the earlier mentioned polysilicon semiconductor layer prior to starting a semiconductor device fabrication process, the polysilicon semiconductor layer is naturally formed during the process.

The inventors had conducted experiments to verify that a polysilicon semiconductor layer containing both oxygen and nitrogen provided the same advantages as those provided by the first to third embodiments. Though the details of the results of the experiments are not given, it was proved that a polysilicon semiconductor layer containing nitrogen at 2 atomic % or greater and oxygen at 1 atomic % or greater provided the same advantageous effects as those of the first to third embodiments. Similarly to the earlier mentioned embodiments, a noncrystal silicon semiconductor layer may be formed over a principal plane of a silicon semiconductor substrate in place of a polysilicon semiconductor layer prior to starting a semiconductor device fabrication process. The noncrystal silicon semiconductor layer is heated during the process to thereby transform into a polysilicon semiconductor layer.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

What is claimed is:

1. A silicon semiconductor substrate comprising:
   a silicon substrate; and
   a silicon semiconductor layer directly contacting one of upper and lower surfaces of said silicon substrate,
   said silicon semiconductor layer being composed of one of polysilicon and noncrystal silicon and containing oxygen in the range of $1\times10^{21}$ atoms/cc to $1\times10^{22}$ atoms/cc both inclusive.

2. A method of fabricating a silicon semiconductor substrate, comprising the step of: providing a silicon substrate; and
   one of the steps of
   (a) forming a silicon semiconductor layer directly contacting one of upper and lower surfaces of said silicon substrate, said silicon semiconductor layer being composed of polysilicon and containing oxygen in the range of $1\times10^{21}$ atoms/cc to $1\times10^{22}$ atoms/cc both inclusive;
   (b) forming a silicon semiconductor layer directly contacting one of upper and lower surfaces of said silicon substrate, said silicon semiconductor layer being composed of polysilicon and containing nitrogen in the range of $2\times10^{21}$ atoms/cc to $1\times10^{22}$ atoms/cc both inclusive; and
   (c) forming a silicon semiconductor layer directly contacting one of upper and lower surfaces of said silicon substrate, said silicon semiconductor layer being composed of polysilicon and containing nitrogen at $1\times10^{21}$ atoms/cc or greater and oxygen at $5\times10^{20}$ atoms/cc or greater.

3. A method of fabricating a silicon semiconductor substrate, comprising one of the steps of:
   (a) forming a silicon semiconductor layer at one of upper and lower surfaces of said substrate, said silicon semiconductor layer being composed of noncrystal silicon and containing oxygen in the range of $1\times10^{21}$ atoms/cc to $1\times10^{22}$ atoms/cc both inclusive;
   (b) forming a silicon semiconductor layer at one of upper and lower surfaces of said substrate, said silicon semiconductor layer being composed of noncrystal silicon and containing nitrogen in the range of $2\times10^{21}$ atoms/cc to $1\times10^{22}$ atoms/cc both inclusive; and
   (c) forming a silicon semiconductor layer at one of upper and lower surfaces of said substrate, said silicon semiconductor layer being composed of noncrystal silicon and containing nitrogen at $1\times10^{21}$ atoms/cc or greater and oxygen at $5\times10^{20}$ atoms/cc or greater,
   said method further comprising the step of (d) heating said silicon semiconductor substrate to transform said noncrystal silicon into polysilicon.

4. The method as set forth in claim 3, wherein said step (d) is carried out at a temperature in the range of 800° C. to 1100° C. both inclusive.

5. The method as set forth in claim 4, wherein said step (d) is continued for an hour or longer.

* * * * *